United States Patent [19]

Rambo

[11] 4,010,426
[45] Mar. 1, 1977

[54] RF POWER AMPLIFIER PARALLEL REDUNDANT SYSTEM

[75] Inventor: Sheldon I. Rambo, Baltimore, Md.

[73] Assignee: The United States of America as represented by the Secretary of the Air Force, Washington, D.C.

[22] Filed: Nov. 12, 1975

[21] Appl. No.: 631,290

[52] U.S. Cl. .............................. 330/53; 330/124 D
[51] Int. Cl.² .......................................... H03F 3/60
[58] Field of Search ...... 330/84, 53, 124 R, 124 D; 328/224; 307/219; 333/2, 3, 7 R

[56] References Cited

UNITED STATES PATENTS 3,953,853   4/1976   Carter et al. .............. 330/124 D X Primary Examiner—James B. Mullins
Attorney, Agent, or Firm—Joseph E. Rusz; George Fine

[57] ABSTRACT

An RF power amplifier parallel redundant circuit employs three amplifiers. Under normal operation when all three amplifiers are functioning, the output from a comparator holds a 0°, 60° two-bit phase shifter in the 60° position. When anyone of the amplifiers or any pair of amplifiers fail, the comparator output causes the two-bit phase shifter to switch to the 0° position. The system holds the power output constant at one-fourth the value of each individual amplifier for single or double failures. Only one simple switching position operation is required.

2 Claims, 3 Drawing Figures

RF POWER AMPLIFIER PARALLEL REDUNDANT SYSTEM

STATEMENT OF GOVERNMENT INTEREST

The invention described herein may be manufactured and used by or for the Government for governmental purposes without the payment of any royalty thereon.

BACKGROUND OF THE INVENTION

There are many situations when it is desirable to improve the reliability of an RF amplifier through the use of parallel redundant circuits. In the simplest form, manual switching to remove the defective amplifier and replace it with a good one has been used for many years. For unattended systems, or systems where even brief shutdowns cannot be tolerated, automatic switching has been used. Unfortunately, rather complicated circuitry and components which may limit system reliability have been required.

This invention provides completely automatic switching of a much simpler type than have been employed in the past. Only a two-bit phase shifter and simple sampling-comparing circuit are required. Any pair or any single amplifier may fail with no change in output power.

In an unattended phased array radar, for example, using separate amplifiers in each of 32 antenna feed lines, several amplifiers (1–3) can fail without seriously reducing radiated (or received) power. These amplifiers are usually driven by a "single thread" amplifier from a power divider. Failure of this latter amplifier results in complete transmitter shutdown. The same concept will apply to a receiver chain with summing hybrids and "single thread" amplifier which must be made redundant by some means.

SUMMARY OF THE INVENTION

An RF power amplifier parallel redundant system is provided. Three amplifiers are utilized. Drive power is split into three equal parts. One output drives the first amplifier. The second output is shifted 240° and then drives the second amplifier. The third output is attenuated 3 db, phase shifted 120°, passed through a 0°, 60° two bit phase shifter to the third amplifier. Outputs from the first and second amplifiers are combined in a first hybrid. A portion of the power is absorbed in a first load, and the remainder is applied to a second hybrid. The output from the third amplifier is also applied to the second hybrid. A portion of the two powers into the second hybrid is absorbed by a second load, and the remainder is used to drive following stages. A directional coupler samples this power output, detects it, and compares the resultant video with a reference signal. Under normal operation when all three amplifiers are functioning the output from the comparator holds the two bit phase shifter in the 60° position. When any one of the amplifiers or any pair of the amplifiers fail, the comparator output causes the two bit phase shifter to switch to the 0° position, if such switching is required to maintain constant power output.

DETAILED DESCRIPTION OF THE PREFERRED EMBODIMENT

Figure 1:
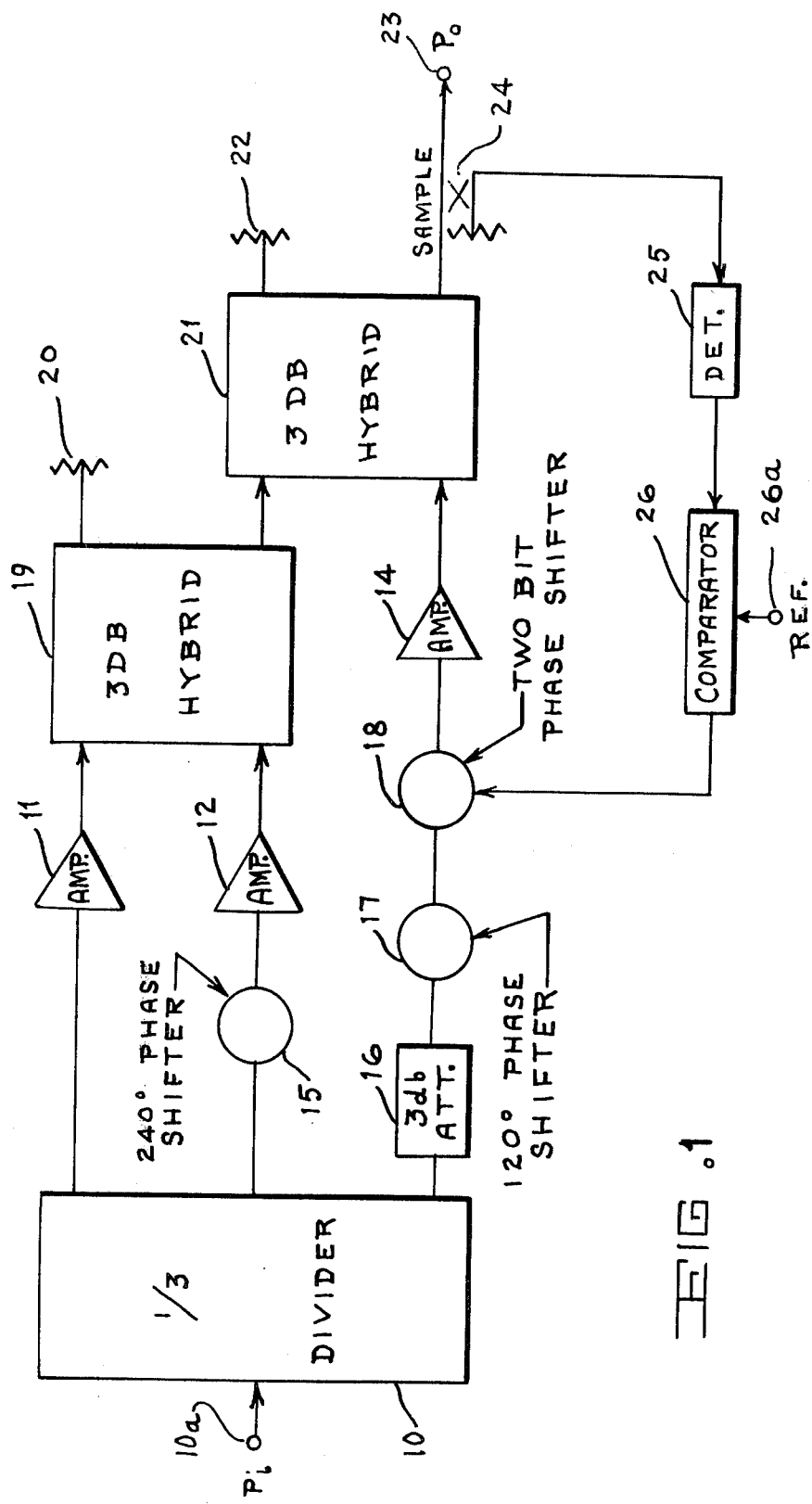
FIG. 1 shows in block diagram form a preferred embodiment of the RF power amplifier parallel redundant system.
Figure 2A:
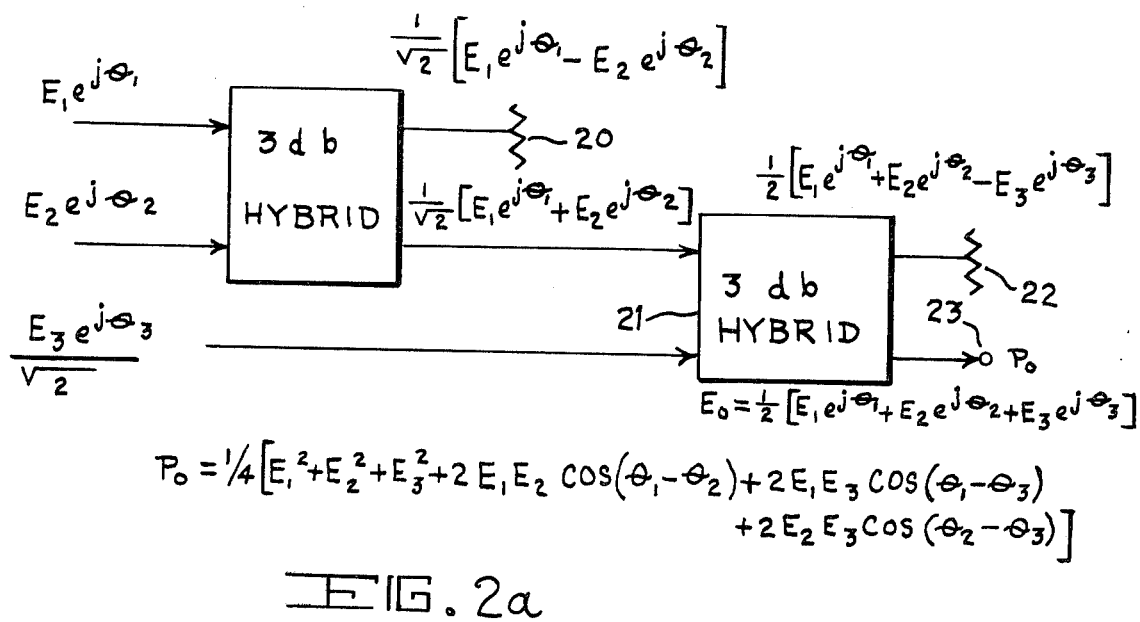
FIGS. 2a and 2b show the RF voltages at various terminals of the block diagram of FIG. 1.
Figure 2B:
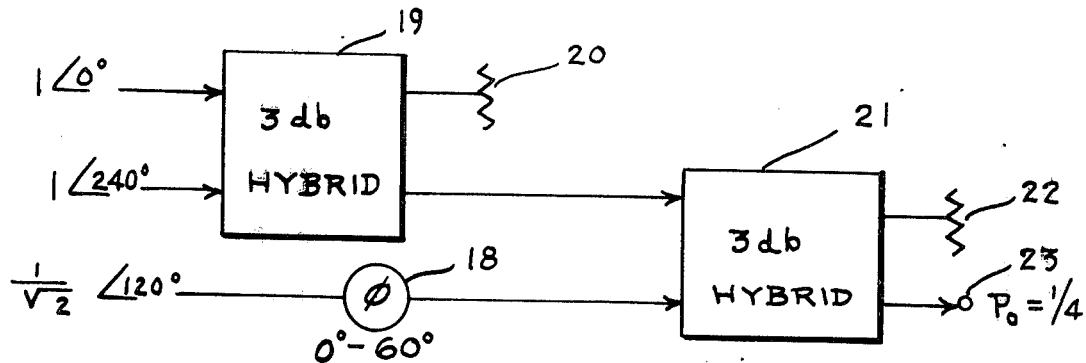

Now referring in detail to FIG. 1, there is shown conventional power splitter 10 receiving at terminal 10a input power, Pi. The drive power is split into three equal parts. Three amplifiers 11, 12, and 14 of gain G and equal phase length are used. Each amplifier is designed to produce four times the desired power output. One of the three parts drives amplifier 11 directly. The second part is shifted 240° by fixed phase shifter 15 (or proper choice of length line) and applied to amplifier 12. The third part is attenuated 3 db by attenuator 16, shifted 120° by fixed phase shifter 17 (or proper choice of length line), and passed through 2-bit (0°, 60°) conventional type phase shifter 18 to amplifier 14. Outputs from amplifiers 11 and 12 are combined in conventional 3 db hybrid 19. A portion of their power is absorbed in load 20, and the remainder is applied to conventional 3 db hubrid 21. Output from amplifier 14 is also applied to 3 db hybrid 21. A portion of the two powers applied to 3 db hybrid 21 is absorbed in load 22, and the remainder shown as output power Po, at terminal 23, is used to drive following stages. Directional coupler 24 samples this output power, detects it with detector 25, and comparator 26 compares the resultant video with a preselected reference signal available from terminal 26a. The output from comparator 26 is fed as a control signal to two bit phase shifter 18.

Under normal operation, when all three amplifiers 11, 12 and 14 are functioning, the output from comparator 26 will hold two bit phase shifter 18 in the 60° position. When any one of the amplifiers or any pair of amplifiers fail, comparator 26 output will cause two bit phase shifter 18 to switch to the 0° position, if such switching is required to maintain constant Po. This configuration holds the power output constant at one-fourth the value of each individual amplifier for single or double failures. Only one simple switching operation is required. The 3 db hybrids automatically provide proper power addition to maintain constant output. The change in power output level when failures occur is large enough so that the comparator circuit needs only nominal sensitivity.

The principle of operation of this invention can best be understood by referring to FIGS. 3a and 3b. The RF voltages at the inputs and outputs to 3 db hybrid 19 and 20 are shown in FIG. 3a. The output which is held constant is shown as Po at terminal 23. In order to set Po at one-fourth of the power available from one of the amplifiers, set $\theta = 0$, $\theta 2 = 240°$, and $\theta 3 = 180°$. It is assumed that $E1=E2=E3=1$. Then, it is seen that the power output Po can be maintained at one-fourth for all combinations of failures by either changing $\theta 3$ to 120° or leaving it at 180°.

Using the relationships of FIGS. 3a and 3b, it is noted that the changes in Po during various failure modes is great enough to make the comparator circuit very simple. Po either drops to zero or rises from one-fourth to three-fourths (a 3 to one change). Positive switching to return the Po to one-fourth is therefore assured.

What is claimed is:

1. RF power amplifier parallel redundant system being comprised of means to divide input power into equal first, second, and third drive powers, first, second and third power amplifiers of equal gain and equal phase length, each power amplifier providing four times the desired power, said first drive power being fed to said first power amplifier, first means to phase shift said second drive power 240° prior to reception thereof by said second power amplifier, second means to phase shift 120° said third drive power, a two bit 0°, 60° phase shifter normally in the 60° position with said three power amplifiers in operation, the output of said two bit 0°, 60° phase shifter being connected to the input of said third amplifier, the 120° phase shifted drive power passing through said two bit phase shifter, first and second 3 db hybrids, said first 3 db hybrid combining the output powers from said first and second power amplifiers, a first load for said first 3 db hybrid absorbing a portion of the drive powers combined in said first 3 db hybrid, the remainder being applied to said second 3 db hybrid, the output power of said third power amplifier also being applied to said second 3 db hybrid, a second load for said second 3 db hybrid absorbing a portion of the two powers combined in said 3 db hybrid, and the remainder being the system output power, a directional coupler sampling said system output power, means to detect said system output power, and means to compare the sampled system output power to a preselected reference to provide a control signal therefrom to said two bit 0°, 60° phase shifter for shifting thereof upon the malfunctioning of at least one of said power amplifiers.

2. RF power amplifier parallel redundant system as described in claim 1 further including a 3 db attenuator interposed at the input of said 120° phase shift means.

* * * * *